(12) United States Patent
Shimamura et al.

(10) Patent No.: US 8,808,656 B2
(45) Date of Patent: Aug. 19, 2014

(54) GARNET-TYPE SINGLE CRYSTAL, OPTICS USING SAME AND RELATED APPARATUS THEREOF

(75) Inventors: Kiyoshi Shimamura, Ibaraki (JP); Encarnacion Antonia Garcia Villora, Ibaraki (JP); Yasuhiko Kuwano, Tokyo (JP)

(73) Assignee: National Institute for Materials Science, Ibaraki (JP)

( * ) Notice: Subject to any disclaimer, the term of this patent is extended or adjusted under 35 U.S.C. 154(b) by 708 days.

(21) Appl. No.: 13/055,232

(22) PCT Filed: Jul. 24, 2009

(86) PCT No.: PCT/JP2009/063279
§ 371 (c)(1),
(2), (4) Date: Apr. 5, 2011

(87) PCT Pub. No.: WO2010/010950
PCT Pub. Date: Jan. 28, 2010

(65) Prior Publication Data
US 2011/0175028 A1 Jul. 21, 2011

(30) Foreign Application Priority Data

Jul. 25, 2008 (JP) ................. 2008-192526
Jul. 25, 2008 (JP) ................. 2008-192527

(51) Int. Cl.
*C03B 29/00* (2006.01)
*G02B 1/02* (2006.01)

(52) U.S. Cl.
USPC ........... 423/263; 423/265; 117/940; 117/945; 252/301.4 H; 607/94; 313/110

(58) Field of Classification Search
USPC ............. 423/263, 265; 117/940, 945; 252/301.4 H; 607/94; 313/110; 250/1
See application file for complete search history.

(56) References Cited

U.S. PATENT DOCUMENTS

| 5,770,101 | A | 6/1998 | Fujii et al. |
| 6,409,938 | B1 * | 6/2002 | Comanzo ............... 252/301.4 R |
| 2008/0100909 | A1 | 5/2008 | Tsuda |

FOREIGN PATENT DOCUMENTS

| JP | 6-260322 | 9/1994 |
| JP | 2008-113004 | 5/2008 |

OTHER PUBLICATIONS

International Search Report issued Oct. 13, 2009 in International (PCT) Application No. PCT/JP2009/063279.
L. Y. Liu et al., "Generation of "Type II" $Fe^{4+}$ Ions in $Ca^{2+}$ and $F^-$ Doped Yttrium Iron Garnet", Journal of Magnetism and Magnetic Materials, vol. 78, pp. 67-72, 1989.

* cited by examiner

*Primary Examiner* — Steven Bos
(74) *Attorney, Agent, or Firm* — Wenderoth, Lind & Ponack, L.L.P.

(57) ABSTRACT

A garnet-type single crystal is represented by a general formula, $A_3B_2C_3O_{12}$ (having a crystal structure with three sites A, B and C occupied by cations, wherein A represents an element occupying the site A, B represents an element occupying the site B, C represents an element occupying the site C, O represents an oxygen atom), and contains fluorine, in which the fluorine attains any one or both of substituting for the oxygen atom or compensating for oxygen defect.

14 Claims, 5 Drawing Sheets

GARNET-TYPE SINGLE CRYSTAL, OPTICS USING SAME AND RELATED APPARATUS THEREOF

This application is a U.S. national stage of International Application No. PCT/JP2009/063279 filed Jul. 24, 2009.

TECHNICAL FIELD

The present invention relates to a garnet-type single crystal represented by a general formula, $A_3B_2C_3O_{12}$ (having a crystal structure with three sites A, B and C occupied by cations, wherein A represents an element occupying the site A, B represents an element occupying the site B, C represents an element occupying the site C, O represents an oxygen atom), and to optical components using it and its related instruments.

BACKGROUND ART

These days required are increased integration of electronic devices and increased operation speed thereof, and for satisfying these requirements, the development of micropatterning technology is remarkable. As micropatterning technology, known is an immersion exposure technique (for example, Patent Reference 1).

The immersion exposure apparatus described in Patent Reference 1 comprises at least a lighting optical system including a photoexposure source of ArF excimer laser, a reticle (mask), a projection optical system, a liquid feeding unit and a liquid recovering unit. In the immersion exposure apparatus, the space between the wafer surface and the optical element on the wafer side of the projection optical system is filled with a liquid while the reticle pattern image is transferred onto the wafer.

The optical element comprises a liquid, of which the refractive index to the light at a wavelength of 193 nm from the ArF excimer laser is within a range of from 1.60 to 1.66, a substrate (lens) of which the refractive index to the light at a wavelength of 193 nm is within a range of from 2.10 to 2.30, and an antireflection film formed on the surface of the substrate to be in contact with the liquid. As the liquid, used is decalin ($C_{10}H_{18}$); as the substrate, used are garnet (lutetium aluminium garnet [$Lu_3Al_5O_{12}$:LuAG], germanate, etc.] and spinel ceramic ($Mg_2Al_2O_4$, etc.); and as the antireflection film, used is a laminate film of a metal oxide layer and a fluoride layer. Having the constitution, the light from the ArF excimer laser is prevented from reflecting between the liquid and the substrate, therefore attaining a high-resolution immersion exposure apparatus.

On the other hand, it is known that the resolution of the immersion exposure apparatus depends on the material having the smallest refractive index among the refractive index of the resist to be arranged on the wafer, the substrate (lens) of the optical element, and the liquid. A resist having a refractive index of more than 1.7 and a liquid having a refractive index of more than 1.6 have been developed; and a substrate having a refractive index of more than 1.7 is needed.

Patent Reference 1 describes use of WAG or the like as the substrate having a refractive index of from 2.1 to 2.30, in which, however, the transmittance of the substrate for the light from the photoexposure source (at a wavelength of 193 nm in Patent Reference 1) is not enough and therefore use of an antireflection film for preventing reflectivity depression is needed. For providing such an antireflection film, employed is a known physical or chemical vapor deposition method, which, however, makes the process complicated and increases the production cost. Accordingly, a substrate not requiring an antireflection film is desired.

Patent Reference 1: JP-A 2008-113004

DISCLOSURE OF THE INVENTION

Problems that the Invention is to Solve

In consideration of the above-mentioned situation, the present invention has an object of providing a garnet-type single crystal having an increased transmittance in a vacuum UV range, optical components using it, and its related instruments.

Means for Solving the Problems

For solving the above-mentioned problems, the invention has the following characteristics.

The first aspect of the invention is a garnet-type single crystal represented by a general formula, $A_3B_2C_3O_{12}$ (having a crystal structure with three sites A, B and C occupied by cations, wherein A represents an element occupying the site A, B represents an element occupying the site B, C represents an element occupying the site C, O represents an oxygen atom), which contains fluorine as an element for attaining any one or both of substituting for the oxygen atom or compensating for oxygen defect.

The second aspect of the invention is subsidiary to the aspect of the first invention, wherein the fluorine content is at most 5 mol %.

The third aspect of the invention is subsidiary to the first or second aspect of the invention, which contains, as an element of attaining any one or both of substituting for the element occupying the site A, the element occupying the site B or the element occupying the site C, or compensating for the element defect, at least one element selected from a group consisting of monovalent elements, divalent elements and trivalent elements and having an electronegativity of at most 1.35.

The fourth aspect of the invention is subsidiary to the third aspect of the invention, wherein the monovalent element is Li.

The fifth aspect of the invention is subsidiary to the third aspect of the invention, wherein the divalent element is any one or both of Mg or Ca.

The sixth aspect of the invention is subsidiary to the first aspect of the invention, wherein the garnet-type single crystal is a single crystal selected from a group consisting of $Y_3Al_5O_{12}$, $Lu_3Al_5O_{12}$ and $(Y_{1-x}Lu_x)_3Al_5O_{12}$ (0<x<1).

The seventh aspect of invention is an optical component that transmits light in a vacuum UV range, which is formed of the garnet-type single crystal of the above first or second aspect of the invention.

The eighth invention is a semiconductor-related instrument having an optical component that transmits light in a vacuum UV range, wherein the optical component is the optical component of the above seventh aspect of the invention.

The ninth invention is an optics-related instrument having an optical component that transmits light in a vacuum UV range, wherein the optical component is the optical component of the above seventh aspect of the invention.

Effects of the Invention

The garnet-type single crystal of the invention contains fluorine, in which the fluorine substitutes for the oxygen atom in the garnet-type single crystal or compensates for oxygen defect. Substituting for the oxygen atom in the single crystal, fluorine increases the band gap in the single crystal owing to the maximum electronegativity thereof. As a result, the absorption end of the single crystal is shifted to the short wavelength side and the transmittance in a vacuum UV range is thereby increased. Compensating for the oxygen defect in the single crystal, fluorine acts to increase the transmittance at around the absorption end (vacuum UV range) caused by the defects in the single crystal.

A garnet-type single crystal is known to have a high refractive index, and is therefore applicable not only to lenses in immersion exposure apparatus but also to other optical components such as prisms, window parts, etc. These optical components are usable in semiconductor-related instruments such as immersion exposure apparatus, interferometers and the like, and also in optics-related instruments such as imaging apparatus including digital cameras, and microscopes, etc.

BEST MODE FOR CARRYING OUT THE INVENTION

The garnet-type single crystal of the invention, and optical components using it and its related instruments are described hereinunder with reference to the drawings. The present inventors have found that the transmittance of already-existing garnet-type single crystals can be increased by utilizing the absorption end shift in the transmission spectrum thereof and the defect density control in the crystals, and have completed the present invention.

The garnet-type single crystal as referred to in this description is a single crystal of a compound having a crystal structure represented by the general formula $A_3B_2C_3O_{12}$. In this, A is an element occupying a site A (hereinafter element A), B is an element occupying a site B (hereinafter element B), C is an element occupying a site C (hereinafter element C), O is an oxygen atom. Specifically, the garnet-type single crystal includes three sites, site A, site B and site C occupied by cations, in which each site allows solid solution of plural types of ions. Accordingly, there exist garnet-type single crystals having different compositions. The material planning for such garnet-type single crystals may be attained with reference to the relational formula between the composition and the structure described in, for example, LANDOLT-BORNSTEIN Group III, 12a (Garnets and Perovskites), p.p. 22 (1.1.3: Lattice parameters of garnets), Springer-Verlag Berlin, Heidelberg, N.Y., 1978.

In particular, for use for the lens (optical component) of an immersion exposure apparatus, a type of a semiconductor-related instrument, the element A may be at least one selected from a group consisting of La, Gd, Y and Lu, the element B may be at least one selected from a group consisting of Lu, Sc, Ga and Al, and the element C may be any one or both of Ga or Al. Naturally, the site A and the site B may be the same element, and the site B and the site C may be the same element. Selected from these element groups, a single crystal having a high refractivity can be constructed.

Above all, from the viewpoint of the producibility and the practicability thereof, preferred are $Y_3Al_5O_{12}$ (hereinafter YAG) where the element A is Y and the element B and the element C are Al; $Lu_3Al_5O_{12}$ (hereinafter LuAG) where the element A is Lu and the element B and the element C are Al; and $(Y_{1-x}Lu_x)Al_5O_{12}$ ($0<x<1$) (hereinafter YLuAG) where the element A is Y and Lu and the element B and the element C are Al.

The present inventors have specifically noted the absorption end of the transmission spectrum of garnet-type single crystals and the defects in the crystals, for the purpose of increasing the transmittance, especially the transmittance in a vacuum UV range (the vacuum UV range is within a range of from 10 nm to 200 nm, especially within a range of from 190 nm to 200 nm) of garnet-type single crystals.

Figure 1:
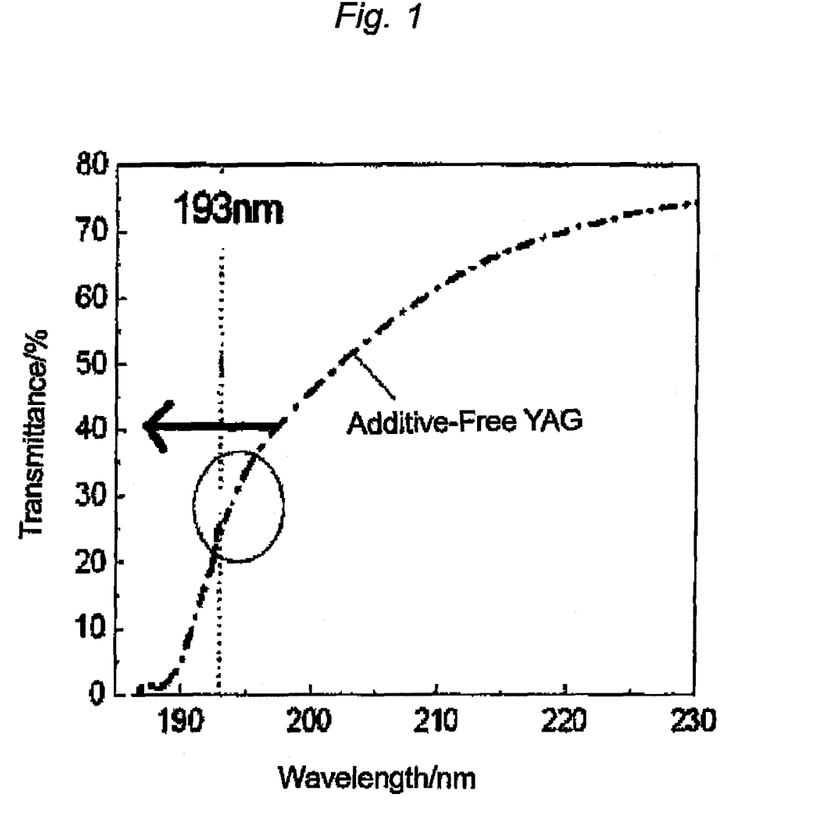
FIG. 1 is a view showing the transmission spectrum of YAG.

FIG. 1 is a view showing the transmission spectrum of YAG YAG is a typical example of garnet-type single crystals; and FIG. 1 shows an illustrative transmission spectrum of YAG produced according to a known single crystal growing method. From the transmission spectrum shown in FIG. 1, it is known that the absorption end of YAG is near the wavelength 193 nm of the light source of an immersion exposure apparatus. The transmittance of YAG at the wavelength 193 nm is about 25% and is low, and is understood to be impracticable. As surrounded by the oval in FIG. 1, the transmission spectrum shows a shoulder, which suggests that the crystal structure of the single crystal has a high defect density. The inventors have noted the absorption end and the defect in the transmission spectrum of the crystal, and have increased the transmittance thereof.

(1) Absorption End Shift

In the transmission spectrum shown in FIG. 1, when the absorption end is shifted to the short wavelength side shown by the arrow, then the transmittance in a vacuum UV range could be increased. In detail, the absorption end is correlated with the band gap, which is simply represented by a formula $E=hc/\lambda$ (where E means the band gap; hc means the photon energy; $\lambda$ means the wavelength at the absorption end). When the wavelength $\lambda$ at the absorption end is shifted to the short wavelength side, then the band gap increases. Accordingly, for increasing the transmittance of a garnet-type single crystal, the band gap of the garnet-type single crystal may be good to increase; and for increasing the band gap thereof, the electronegativity difference between the cation and the anion in the garnet-type crystal may be good to increase.

Table 1 shows the Pauling electronegativity. The data in Table 1 are extracted from J. E. Huheey et al's "Inorganic Chemistry—principles of structure and reactivity", 4th ed. (Hapere Collins, New York, 1993).

TABLE 1

| I | II | III | II | II | II | II | II | II |
|---|---|---|---|---|---|---|---|---|
| H | | | | | | | | |
| 2.2 | | | | | | | | |
| Li | Be | | | | | | | |
| 0.98 | 1.57 | | | | | | | |

TABLE 1-continued

| | | | | | | | | |
|---|---|---|---|---|---|---|---|---|
| Na 0.93 | Mg 1.31 | | | | | | | |
| K 0.82 | Ca 1.00 | Sc 1.36 | Ti 1.54 | V 1.63 | Cr 1.66 | Mn 1.55 | Fe 1.83 1.96$^{II}$ | Co 1.88 |
| Rb 0.82 | Sr 0.95 | Y 1.22 | Zr 1.33 | Nb 1.6$^V$ | Mo 2.16 2.19$^V$ 2.24I$^V$ 2.27$^V$ 2.35$^{VI}$ | Tc 1.9 | Ru 2.2 | Rh 2.28 |
| Cs 0.79 | Ba 0.89 | La 1.10 | Hf 1.3 | Ta 1.5 | W 2.36 | Re 1.9 | Os 2.2 | Ir 2.20 |
| Fr 0.7 | Re 0.9 | Ac 1.1 | Rf | Db | Sg | Bh | Hs | Mt |
| II | I | II | III | IV | III | II | I | 0 |
| | | | B 2.04 | C 2.55 | N 3.04 | O 3.44 | F 3.98 | He Ne — |
| | | | Al 1.61 | Si 1.90 | P 2.19 | S 2.58 | Cl 3.16 | Ar — |
| Ni 1.91 | Cu 1.90 2.00$^{II}$ | Zn 1.65 | Ga 1.81 | Ge 2.01 | As 2.18 | Se 2.55 | Br 2.96 | Kr 3.00 |
| Pd 2.20 | Ag 1.93 | Cd 1.96 | In 1.78 | Sn 1.96 1.80$^I$ | Sb 2.05 | Te 2.1 | I 2.66 | Xe 2.60 |
| Pt 2.28 | Au 2.54 | Hg 2.00 | Tl 2.04 1.62$^I$ | Pb 2.33 1.87$^{II}$ | Bi 2.02 | Po 2.0 | At 2.2 | Rn — |

| Ce | Pr | Nd | Pm | Sm | Eu | Gd | Tb | Dy | Ho | Er | Tm | Yb | Lu |
|---|---|---|---|---|---|---|---|---|---|---|---|---|---|
| 1.12 | 1.13 | 1.14 | — | 1.17 | — | 1.20 | — | 1.22 | 1.23 | 1.24 | 1.25 | — | 1.27 |
| Th | Pa | U | Np | Pu | Am | Cm | Bk | Cf | Es | Fm | Md | No | Lr |
| 1.3 | 1.5 | 1.38 | 1.36 | 1.28 | 1.3 | 1.3 | 1.3 | 1.3 | 1.3 | 1.3 | 1.3 | 1.3 | — |

The garnet-type single crystal of the invention contains fluorine (F). As in Table 1, fluorine has the largest electronegativity. The ionic radius of fluorine is smaller than the ionic radius of O, and therefore fluorine can readily substitutes with O in a garnet-type single crystal to thereby increase the electronegativity difference between the cation and the anion in the garnet-type single crystal. As a result, the transmittance of the fluorine-containing garnet-type single crystal increases.

The fluorine content is preferably at most 5 mol %. Even a little substitution of O with F could increase the band gap, and therefore the absorption end could shift toward the short wavelength side and the transmittance in a vacuum UV range increases. When the fluorine content is more than 5 mol %, it is unfavorable since the crystal structure could not be maintained.

Preferably, the garnet-type single crystal of the invention contains, in addition to fluorine, at least one element selected from a group consisting of monovalent elements, divalent elements and trivalent elements and having an electronegativity of at most 1.35. At least one element selected from the group consisting of monovalent elements, divalent elements and bivalent elements substitutes for the cation element (element A, element B and element C) in the garnet-type single crystal. The electronegativity of the selected element is at most 1.35, with which, therefore, electronegativity difference between the cation and the anion of the garnet-type single crystal can increase. When the electronegativity is more than 1.35, it is unfavorable since the electroconductivity difference decreases. More preferably, from the viewpoint of the ionic radius and the electronegativity thereof, an example of the monovalent element is Li and that of the divalent element is Ca.

The content of the selected element is preferably from 0 mol % to 5 mol %. At least fluorine may be good to be contained in the garnet-type single crystal, and therefore, the garnet-type single crystal does not always contain the selected element. When the content is more than 5 mol %, it is unfavorable since the crystal structure could not be maintained.

(2) Defect Concentration Control

As described in the above with reference to FIG. 1, the shoulder in the transmission spectrum is caused by the incompleteness of the crystal structure in the single crystal, or that is, by the defect (oxygen defect and cation defect) therein. Reducing the defect concentration could cancel the shoulder in the transmission spectrum, thereby increasing the transmittance.

The garnet-type single crystal of the invention contains fluorine (F) as described above, and fluorine has a smaller ionic radius than O and can therefore readily fill up the oxygen defect. As a result, the shoulder in the transmission spectrum is lost and the transmittance is thereby increased. The fluorine content is, as described above, preferably at most 5 mol %.

Preferably, the garnet-type single crystal of the invention contains, in addition to fluorine, at least one element selected from the group consisting of monovalent elements, divalent elements and trivalent elements. At least one such element selected from the group consisting of monovalent elements, divalent elements and trivalent elements can readily fill up the cation defect in the cation site (site A, site B and site C) in the garnet-type single crystal. Above all, from the viewpoint of the ionic radius thereof, preferably, an example of the monovalent element is Li and that of the divalent element is Mg. The selected element may be basically any substitutable element; however, in consideration of the absorption end shift to the short wavelength side shown in the above (1), preferred are the elements having an electronegativity of at most 1.35 shown in Table 1. Accordingly, the monovalent element to be selected is preferably Li, and the divalent element is preferably any one or both of Mg or Ca.

The garnet-type single crystal of the invention is such that the absorption end in the transmission spectrum thereof is shifted toward the short wavelength side and the oxygen defect therein is controlled, and therefore the transmittance of the crystal in a vacuum UV range is increased. The garnet-type single crystal is favorable for the lens (optical component) of an immersion exposure apparatus, and for a lens material taking advantage of high transmittance, etc.

The garnet-type single crystal of the invention is known to have a high refractive index; and above all, it has been clarified that a fluorine-added YAG single crystal in which the element A is Y, the element B and the element C are Al has a refractive index of 2.144 in a vacuum UV range (this means the range having a wavelength of from 10 nm to 200 nm), for example, at a wavelength of 193 nm. The present inventors have found that, of garnet-type single crystals, the refractive index of the fluorine-added YAG single crystal greatly differs from the refractive index value of the crystals heretofore known in the art, and is a large value exceeding over the common knowledge.

To that effect, the refractive index of 2.144 in a vacuum UV range (for example, at a wavelength of 193 nm) satisfies the requirement for the projection lens in an immersion exposure apparatus (in that the refractive index is at least 1.7), and therefore, of the garnet-type single crystals of the invention, the fluorine-added YAG single crystal is especially favorable for the projection lens for a immersion exposure apparatus. Of the garnet-type single crystals of the invention, the fluorine-added YAG single crystal has a refractive index on the same level as the refractive index of already-existing LuAG, and in particular, the refractive index thereof at a wavelength of 193 nm is higher than the refractive index of LuAG and the transmittance thereof is also higher than that of LuAG. Accordingly, when the fluorine-added YAG single crystal is used in place of LuAG therein, the resolution of the immersion exposure apparatus can be further increased not requiring an antireflection film. In case where the garnet-type single crystal of the invention is used as the lens of an immersion exposure apparatus, preferred is YAG of the above-mentioned YAG, LuAG and YLuAG from the viewpoint of the transmittance and the refractive index thereof.

The garnet-type single crystal of the invention can be produced, for example, according to a known crystal growing method such as a Czochralski (CZ) method or the like, except that the starting melt contains a fluorine source or a fluorine source and a selected element source. The fluorine source may be selected from a group consisting of a compound of the element A and fluorine constituting the garnet-type single crystal, a compound of the element B and fluorine, a compound of the element C and fluorine, their mixture, and a fluorine-containing gas. For example, when the element A is Y, $YF_3$ is employed as the fluorine source. The fluorine-containing gas is a gas prepared by substituting a part or all of Ar or $N_2$ therein with a fluorine-containing gas such as $CF_4$, $CH_2F_2$, $CH_3F$, $C_2H_5F$, HF, $F_2$, etc.

The element source may be selected from a group consisting of a material of the simple substance of the element to be selected, an oxide of the element to be selected, a compound of the element A constituting the garnet-type single crystal and the element to be selected, a compound of the element B and the element to be selected, a compound of the element C and the element to be selected, their mixtures and their fluorides.

The garnet-type single substance alone is described in detail hereinabove; however, the above principle ((1) absorption end shift and (2) defect concentration control) is applicable to ordinary oxide materials (for example, cubic spinel-type crystals such as typically $(Mg,Zn)Al_2O_4$, $CaAl_2O_4$, $CaB_2O_4$ and $LiAl_5O_8$, cubic perovskite-type crystals, MgO, $(Mg,Zn)O$, $LiNbO_3$, $LiTaO_3$, Mg-doped $LiNbO_3$, Mg-doped $LiTaO_3$, $Al_2O_3$, $TiO_2$, etc.). It is obvious that any one or both of substitution of oxygen with fluorine or filling up of oxygen defect with fluorine in the oxide increases the transmittance of the above-mentioned ordinary oxide materials.

The garnet-type single crystal of the invention is further described with reference to Examples shown below. Needless-to-say, the invention should not be limited by the following Examples.

Example 1

A fluorine-containing garnet-type single crystal was produced. Used was a garnet-type single crystal of a general formula $A_3B_2C_3O_{12}$ where the element A is Y, the element B and the element C are Al, $Y_3Al_5O_{12}$ (YAG). Hereinunder the garnet-type single crystal is referred to as a fluorine-containing YAG single crystal. The fluorine-containing YAG single crystal was grown according to a Czochralski method.

A $Y_2O_3$ powder, an $Al_2O_3$ powder and a $YF_3$ powder each having a purity of 4N were weighed and mixed in a molar ratio of 2.9/5/0.2, and then shaped by pressing. The press-shaped starting material mixture powder was filled in an Ir crucible, and set in a ceramic-made heat-insulating material. The Ir crucible was heated up to about 2000° C. near the melting point of the starting material mixture powder, through high-frequency induction heating thereby to melt the starting material mixture powder. In this, F in the melt was 0.2 mol %.

Next, a YAG seed crystal previously shaped and fixed to a seed holder was kept in contact with the melt so as to be habituated to it and the temperature was thereby controlled. Subsequently, this was pulled up at a pulling rate of 1 mm/hr and with rotating at a rotation frequency of 10 rpm, thereby growing a fluorine-containing YAG single crystal.

Figure 2:
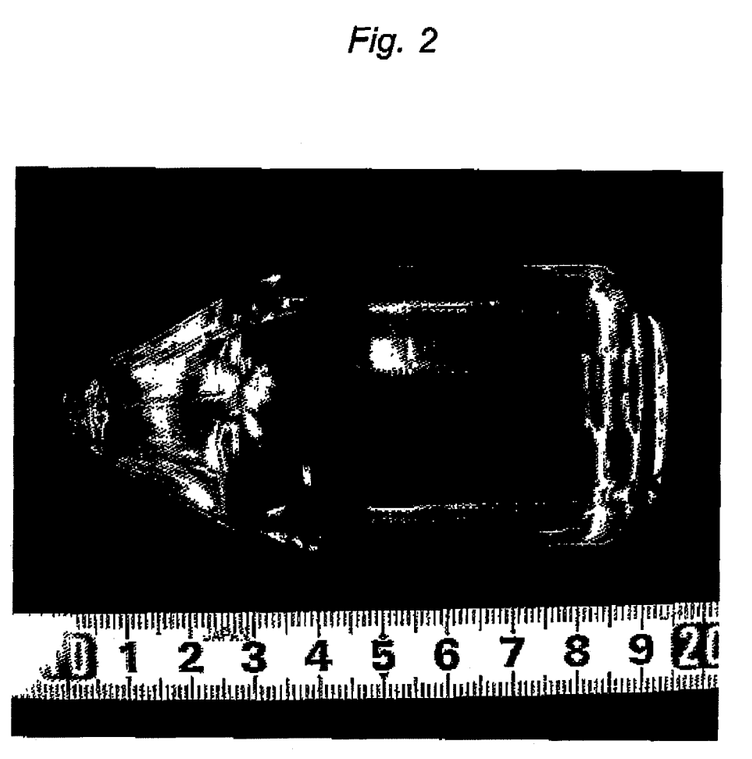
FIG. 2 is a photographic picture of the fluorine-containing YAG single crystal produced in Example 1.
Figure 3:
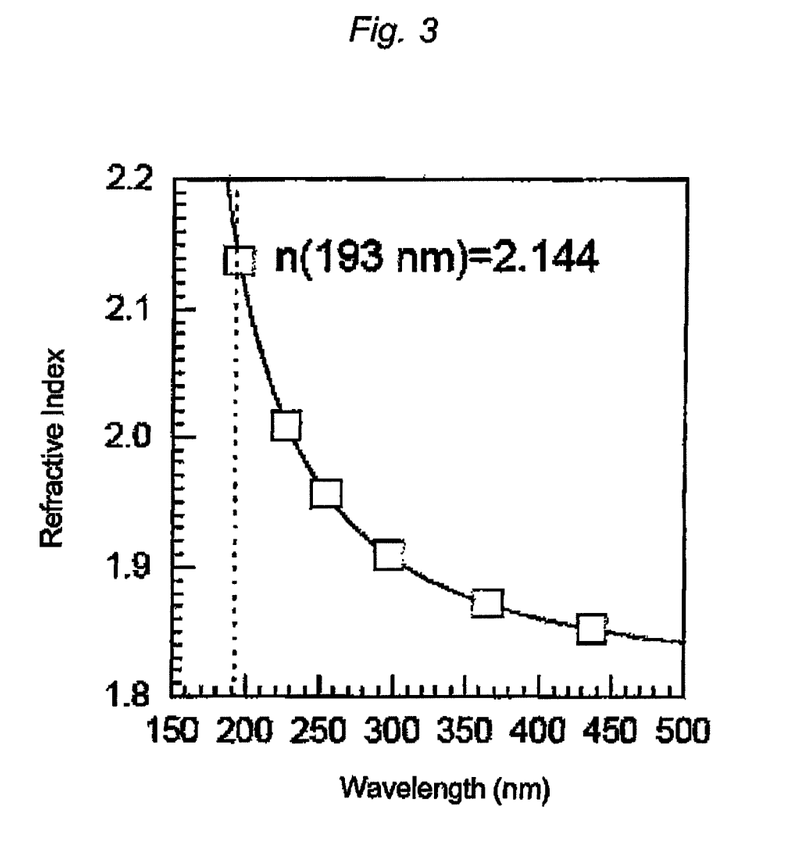
FIG. 3 is a view showing the wavelength dependence of the refractive index of the fluorine-containing YAG single crystal produced in Example 1.
Figure 4:
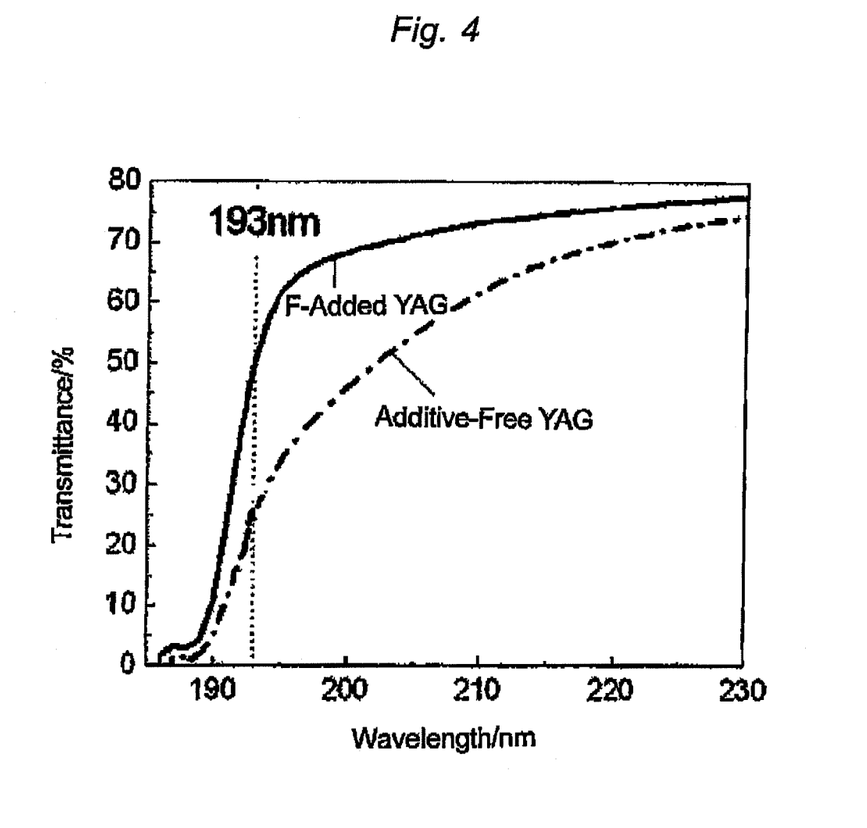
FIG. 4 is a view showing the transmission spectrum of the YAG single crystal measured in Example 1 and Comparative Example 1.

Thus produced, the fluorine-containing YAG single crystal was observed. The observation result is shown in FIG. 2. The wavelength dependence of the refractive index of the fluorine-containing YAG single crystal was measured. As a sample for measurement, the fluorine-containing YAG single crystal was cut and polished to prepare a prism. For the measurement, employed was a minimum deviation method. The found data are shown in FIG. 3. Further, the obtained fluorine-containing YAG single crystal was cut and polished, and its transmission spectrum was measured. The thickness of the sample for measurement was 1 mm. The found data are shown in FIG. 4. The evaluation of the fluorine-containing YAG single crystal is described below.

Comparative Example 1

An additive-free garnet-type single crystal (hereinafter this is referred to as an additive-free YAG single crystal) was produced according to the same process as in Example 1 except that the $YF_3$ powder was not used. Thus obtained, the additive-free YAG single crystal was cut and polished in the same manner as in Example 1, and its transmission spectrum was measured. The found data are additionally shown in FIG. 3.

FIG. 2 is a photographic picture of the fluorine-containing YAG single crystal produced in Example 1.

As shown in FIG. 2, a homogeneous, colorless and transparent YAG single crystal was produced even though fluorine was added thereto (Example 1). An already-existing crystal growing method is applicable to producing the garnet-type single crystal of the invention, which is therefore advantageous for ready practicability.

FIG. 3 is a view showing the wavelength dependence of the refractive index of the fluorine-containing YAG single crystal produced in Example 1.

As obvious from FIG. 3, the refractive index in a vacuum UV range (at a wavelength of at most 200 nm) was at least 2.1; and more precisely, the refractive index at a wavelength of 193 nm was 2.144. This value is far larger than the value of the refractive index (2.0) heretofore known in the art, and is larger than that of LuAG. This suggests that the fluorine-containing YAG single crystal would be favorable for the projection lens in an immersion exposure system in place of LuAG. As having such a high refractive index, the single crystal is expected to realize high resolution immersion exposure apparatus. In addition, the applicability of the fluorine-containing YAG single crystal to non-spherical lenses of imaging apparatus such as digital cameras or the like, a type of optics-related instruments may be taken into consideration; and since the single crystal has a high refractive index, the lens thickness may be reduced and the imaging apparatus is expected to be down-sized. Further, the applicability of the fluorine-containing YAG single crystal to prisms, window parts and the like as optical components other than lens may be taken into consideration. Employing such optical components for interferometers as semiconductor-related Instruments and also for microscopes and others as optics-related instruments is also taken into consideration. In addition, since the starting materials for the fluorine-containing YAG single crystal are inexpensive and easily available, the single crystal enables cost reduction as compared with LuAG.

FIG. 4 is a view showing the transmission spectrum of the YAG single crystal measured in Example 1 and Comparative Example 1.

As in FIG. 4, the transmission spectrum of Comparative Example 1 (additive-free YAG) is the same as the transmission spectrum of YAG shown in FIG. 1. From the transmission spectrum in FIG. 4, it is known that the absorption end of the transmission spectrum is shifted to the short wavelength side owing to the addition of fluorine. In detail, the transmittance (50%) in a vacuum UV range (especially at a wavelength of 193 nm) of the fluorine-containing YAG single crystal (F-added YAG) in Example 1 is higher by 2 times than the transmittance (25%) of the additive-free YAG in Comparative Example 1. Accordingly, when the F-added YAG is used as the substrate for the optical element of the high-resolution immersion exposure apparatus, the apparatus does not require an antireflection film and therefore can attain cost reduction.

When the purity 4N of the starting materials is ranked to the level of 6N, then further increase in the transmittance could be expected.

Example 2

Figure 5:
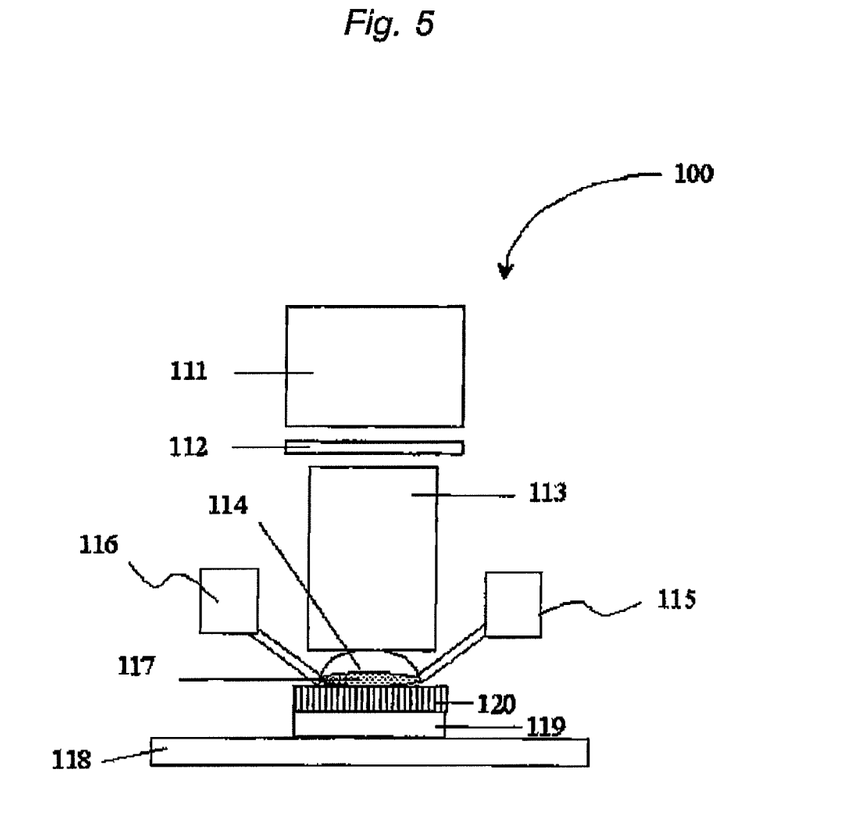
FIG. 5 is a schematic view of an immersion exposure apparatus using the lens formed of the fluorine-containing YAG single crystal produced in Example 1.

FIG. 5 is a schematic view of an immersion exposure apparatus using the lens formed of the fluorine-containing YAG single crystal produced in Example 1.

The immersion exposure apparatus 100 comprises a lighting optical system 111, a reticle (mask) 112, a projection optical system 113, a projection lens 114, a liquid feeding unit 115, a liquid recovering unit 116, a liquid 117, and a stage 118 with a photoexposure substrate 119 mounted thereon.

The photoexposure substrate 119 is coated with a resist 120. As the resist 120, employable is a known immersion resist, and for example, usable is a commercially-available methacrylic resin-base ArF resist.

The lighting optical system 111 includes a light source, and functions so that the reticle 112 is irradiated with the light from the light source. In this, an ArF excimer laser having a wavelength of 193 nm was used as the light source. If desired, the lighting optical system 110 may comprise various optical elements such as mirror, lens and others as combined. The reticle 112 is an original plate to be transcribed onto the photoexposure substrate 119 through exposure to light.

At the top of the projection optical system 113, there is provided a projection lens 114, and the projection optical system 113 and the projection lens 114 function so as to reduce the light having passed through the reticle 112 and to make the photoexposure substrate 119 irradiated with the thus-reduced light. If desired, the projection optical system 113 may comprise various optical elements such as mirror, lens and others as combined. In this, the projection lens 114 is formed of the fluorine-containing YAG single crystal produced in Example 1.

The immersion exposure apparatus 100 is provided with a liquid feeding unit 115 and the liquid recovering unit 116 so that the space between the projection lens 114 and the resist 120 could be filled with a liquid 117. As the liquid 117, employed is a known high-refractivity liquid.

The immersion exposure apparatus 100 acts as follows.

The reticle 112 is irradiated with the light from the light source in the lighting optical system 111. The light having passed through the reticle 112 then passes through the projection optical system 113 and the projection lens 114 in that order. In this step, the pattern of the reticle 112 is reduced. During projection of the pattern of the reticle 112, the liquid feeding unit 115 and the liquid recovering unit 116 function so that the space between the projection lens 114 and the resist 120 could be filled up with the liquid 117. The light of the reduced pattern is refracted by the liquid 117, and the resist 120 is thus exposed to the light. In this process, when an ArF resist having a refractive index of 1.75 was used as the resist 120, a high-refractivity fluid having a refractive index of 1.6 was used as the liquid 117, and the projection lens 114 formed of the fluorine-containing YAG single crystal produced in Example 1 was used as the projection lens 114, then the resolution of less than 30 nm was realized. In this, since the fluorine-containing YAG single crystal having an increased transmittance in a vacuum UV range is used as the projection lens 114, the immersion exposure apparatus 100 does not require an antireflection film.

INDUSTRIAL APPLICABILITY

Of the garnet-type single crystal of the invention, the absorption end of the transmission spectrum is shifted toward the short wavelength side, and the oxygen defect is controlled in the single crystal; and therefore, the transmittance of the single crystal in a vacuum UV range is increased. Since the garnet-type single crystal has a high refractive index, it is applicable not only to lenses of immersion exposure apparatus but also to other optical components such as prisms, window parts, etc. These optical components are usable in semiconductor-related instruments such as immersion exposure apparatus, interferometers and the like, and also in optics-related instruments such as imaging apparatus including digital cameras, and microscopes, etc.

The invention claimed is:

1. A garnet single crystal represented by a general formula, $A_3B_2C_3O_{12}$,
   wherein the garnet single crystal has a structure with three sites A, B and C occupied by cations,
   wherein A represents an element occupying the site A,
   wherein B represents an element occupying the site B,
   wherein C represents an element occupying the site C, and
   wherein O represents an oxygen atom;
   wherein the garnet single crystal is a single crystal selected from the group consisting of $Y_3Al_5O_{12}$, $Lu_3Al_5O_{12}$ and $(Y_{1-x}Lu_x)_3Al_5O_{12}$,
   wherein $0<x<1$; and
   wherein the garnet single crystal contains fluorine as an element for attaining any one or both of substituting for the oxygen atom or compensating for oxygen defect.

2. The garnet single crystal as claimed in claim 1, wherein the fluorine content is at most 5 mol %.

3. The garnet single crystal as claimed in claim 1, which further contains, at least one element selected from the group consisting of monovalent elements, divalent elements and trivalent elements and having an electronegativity of at most 1.35 for substituting for a cation element of the garnet single crystal or for compensating for a cation defect in a cation site of the garnet single crystal.

4. The garnet single crystal as claimed in claim 2, which further contains, at least one element selected from the group consisting of monovalent elements, divalent elements and trivalent elements and having an electronegativity of at most 1.35 for substituting for a cation element of the garnet single crystal or for compensating for a cation defect in a cation site of the garnet single crystal.

5. The garnet single crystal as claimed in claim 3, wherein the monovalent element is Li.

6. The garnet single crystal as claimed in claim 4, wherein the monovalent element is Li.

7. The garnet single crystal as claimed in claim 3, wherein the divalent element is any one or both of Mg or Ca.

8. The garnet single crystal as claimed in claim 4, wherein the divalent element is any one or both of Mg or Ca.

9. An optical component that transmits light in a vacuum UV range, which is formed of the garnet single crystal of claim 1.

10. An optical component that transmits light in a vacuum UV range, which is formed of the garnet single crystal of claim 2.

11. A semiconductor instrument having an optical component that transmits light in a vacuum UV range, wherein the optical component is the optical component of claim 9.

12. A semiconductor instrument having an optical component that transmits light in a vacuum UV range, wherein the optical component is the optical component of claim 10.

13. An optics instrument having an optical component that transmits light in a vacuum UV range, wherein the optical component is the optical component of claim 9.

14. An optics instrument having an optical component that transmits light in a vacuum UV range, wherein the optical component is the optical component of claim 10.

* * * * *